United States Patent
Tu et al.

(10) Patent No.: US 8,569,886 B2
(45) Date of Patent: Oct. 29, 2013

(54) METHODS AND APPARATUS OF UNDER BUMP METALLIZATION IN PACKAGING SEMICONDUCTOR DEVICES

(75) Inventors: Chia-Wei Tu, Chubei (TW); Yian-Liang Kuo, Toufen Township (TW); Tsung-Fu Tsai, Changhua (TW); Ru-Ying Huang, Taipei (TW); Ming-Song Sheu, Hsin-Chu (TW); Hsien-Wei Chen, Sinying (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/302,551

(22) Filed: Nov. 22, 2011

(65) Prior Publication Data

US 2013/0127052 A1     May 23, 2013

(51) Int. Cl.
*H01L 23/485*     (2006.01)
*H01L 21/28*     (2006.01)

(52) U.S. Cl.
USPC ............ 257/738; 257/E23.011; 257/E23.021; 257/737; 257/778; 257/773; 257/774

(58) Field of Classification Search
USPC .......... 257/E23.011, E23.021, 737, 738, 778, 257/773, 774
See application file for complete search history.

(56) References Cited

U.S. PATENT DOCUMENTS

| 7,994,045 | B1 * | 8/2011 | Huemoeller et al. | 438/612 |
|---|---|---|---|---|
| 8,035,226 | B1 * | 10/2011 | Wilcoxen et al. | 257/738 |
| 8,263,486 | B1 * | 9/2012 | Huemoeller et al. | 438/613 |
| 8,283,781 | B2 * | 10/2012 | Wu et al. | 257/738 |
| 2005/0017355 | A1 * | 1/2005 | Chou et al. | 257/738 |
| 2008/0197475 | A1 * | 8/2008 | Huang | 257/690 |
| 2009/0014869 | A1 * | 1/2009 | Vrtis et al. | 257/737 |
| 2009/0250813 | A1 * | 10/2009 | Lin et al. | 257/737 |
| 2009/0278263 | A1 * | 11/2009 | McCarthy et al. | 257/778 |
| 2009/0283905 | A1 * | 11/2009 | Huang et al. | 257/737 |
| 2010/0193950 | A1 * | 8/2010 | Lee et al. | 257/738 |
| 2010/0213608 | A1 * | 8/2010 | Lau et al. | 257/737 |
| 2010/0264516 | A1 * | 10/2010 | Lin et al. | 257/531 |
| 2011/0024901 | A1 * | 2/2011 | Yamashita et al. | 257/737 |
| 2011/0186995 | A1 * | 8/2011 | Alvarado et al. | 257/737 |
| 2011/0204515 | A1 * | 8/2011 | Fazelpour | 257/738 |
| 2011/0298137 | A1 * | 12/2011 | Pagaila et al. | 257/773 |
| 2012/0038047 | A1 * | 2/2012 | Do et al. | 257/741 |
| 2012/0061823 | A1 * | 3/2012 | Wu et al. | 257/737 |
| 2012/0098123 | A1 * | 4/2012 | Yu et al. | 257/737 |
| 2012/0104604 | A1 * | 5/2012 | McCarthy et al. | 257/738 |
| 2012/0199967 | A1 * | 8/2012 | Stacey | 257/737 |
| 2012/0228765 | A1 * | 9/2012 | Alvarado et al. | 257/737 |
| 2013/0015555 | A1 * | 1/2013 | Lin et al. | 257/531 |
| 2013/0026618 | A1 * | 1/2013 | Chen | 257/737 |
| 2013/0037948 | A1 * | 2/2013 | Samoilov et al. | 257/738 |

* cited by examiner

*Primary Examiner* — A O Williams
(74) *Attorney, Agent, or Firm* — Slater & Matsil, L.L.P.

(57) ABSTRACT

Methods and apparatuses for wafer level packaging (WLP) semiconductor devices are disclosed. A redistribution layer (RDL) is formed on a first passivation layer in contact with a conductive pad over a surface of a die. The RDL layer is on top of a first region of the first passivation layer. A second passivation layer is formed on the RDL layer with an opening to expose the RDL layer, and over the first passivation layer. An under bump metallization (UBM) layer is formed over the second passivation layer in contact with the exposed RDL layer. A second region of the first passivation layer disjoint from the first region is determined by projecting an outer periphery of a solder ball or other connector onto the surface.

20 Claims, 4 Drawing Sheets

METHODS AND APPARATUS OF UNDER BUMP METALLIZATION IN PACKAGING SEMICONDUCTOR DEVICES

BACKGROUND

Semiconductor devices are used in a variety of electronic applications, such as personal computers, cell phones, digital cameras, and other electronic equipment, as examples. The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

One type of smaller packaging for semiconductor devices that has been developed is wafer level packaging (WLP), in which integrated circuit die are packaged in packages that typically include a redistribution layer (RDL) that is used to fan out wiring for contact pads of the integrated circuit die so that electrical contact can be made on a larger pitch than contact pads of the die. Throughout this description, the term die is used to refer to both the singular and the plural.

WLP packages have been applied more and more in integrated circuit packaging due to the advantages of cost and simple structure. However, for some WLP packages, stress has been found to be directly applied on passivation (PSV) and extreme low-k (ELK) layers, causing ELK/PSV crack/delamination by severe fatigue loading during reliability testing.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

Figure 1:
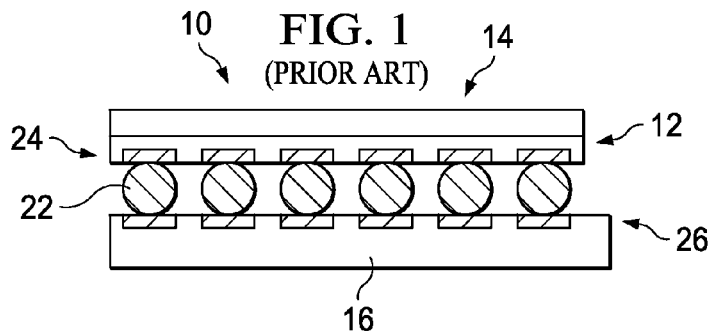
FIGS. 1(a)-1(f) illustrate an embodiment of a WLP process, shown in cross-sectional view or in top view.

The making and using of the embodiments of the present disclosure are discussed in detail below. It should be appreciated, however, that the embodiments of the present disclosure provide many applicable concepts that can be embodied in a wide variety of specific contexts. The specific embodiments discussed are merely illustrative of specific ways to make and use the embodiments, and do not limit the scope of the disclosure.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Wafer level packages (WLP) are commonly used with integrated circuits (ICs) demanding high speed, high density, and greater pin count. FIGS. 1(a)-1(f) illustrate an embodiment of a WLP process, shown in cross-sectional view or in top view. Illustrated in FIG. 1(a), a semiconductor die 30 is formed on a substrate which is made of silicon or other bulk semiconductor material. Semiconductor die 30 is part of a base semiconductor wafer, which contains additional semiconductor die not shown. The illustrative process shown in FIGS. 1(a)-1(e) applies to the packaging of other die as well. The length of the die 30 is only for illustrative purposes and may not be drawn to scale. The process is only illustrated for connection of one contact pad with one solder ball/bump through redistribution layer (RDL) as shown in FIG. 1(e). The die 30 may comprise a plurality of contact pads connected to a plurality of solder ball/bumps through a network of RDLs according to its functional design. The electrical signals from semiconductor die 30 are routed through the network of RDLs to one or more of the solder bumps according to the function of the semiconductor device.

Semiconductor die 30 includes a surface 31, which may be an active surface, further containing active and passive devices, conductive layers, and dielectric layers according to the electrical design of the die. A conductive layer 32 is formed as a contact pad on surface 31 using a patterning and deposition process. Semiconductor die 30 may have a plurality of contact pads 32. Conductive pad 32 may be made with aluminum (Al), copper (Cu), tin (Sn), nickel (Ni), gold (Au), silver (Ag), or other electrically conductive material. The deposition of conductive pad 32 uses an electrolytic plating or electroless plating process. The size, shape, and location of the contact pad 32 are only for illustration purposes and are not limiting. The plurality of contact pads of the die 30, which are not shown, may be of the same size or of different sizes.

A passivation layer 34 is formed over semiconductor die 30 on top of the surface 31 and on top of the conductive pad 32 for structural support and physical isolation. Passivation layer 34 can be made with silicon nitride (SiN), silicon dioxide (SiO2), silicon oxynitride (SiON), polyimide (PI), benzocyclobutene (BCB), polybenzoxazole (PBO), or other insulating material. An opening of the passivation layer 34 is made by removing a portion of passivation layer 34 using a mask-defined photoresist etching process to expose conductive pad 32. The size, shape, and location of the opening made are only for illustration purposes and are not limiting. It is advantageous to expose a portion of the top surface of the conductive pad 32, as shown in FIG. 1(a).

An RDL portion 46 is deposited over the passivation layer 34 and conductive pad 32. The RDL portion 46 may be deposited following the contour of passivation layer 34. RDL 46 can be made with, e.g., Al, Ni, nickel vanadium (NiV), Cu, or a Cu alloy. RDL 46 can be made by an electrolytic plating or electroless plating process. RDL 46 can be made with a single layer, or multiple layers using an adhesion layer of Ti, TiW, or Cr, for example. The die 30 is connected to a number of RDL portions 46 to form a network of inter-level interconnects which may electrically connect to the contact pads of semiconductor die 30 according to the function of the semiconductor device. RDL 46 may be used to refer a portion of RDL.

As illustrated in FIG. 1(a), the height and length of the RDL 46 are only shown for illustrative purposes and not limiting. One end 46a of the RDL 46 is deposited on top of the passivation layer 34 and in contact with the conductive pad 32 through the passivation layer opening. The shape of the 46a end is shown for illustration purposes and are not limiting. There may be other kinds of shapes for the 46a end of the RDL 46 layer. For example, the end of 46a may extend further to cover more surfaces of passivation layer 34, beyond the shape of the conductive pad 32.

On the other hand, the other end 46b of the RDL 46 is stopped somewhere beyond the conductive pad 32, but before a solder ball projection region where, as described below, a solder ball/bump may be mounted. The solder ball projection region may be determined by projecting other connectors instead of solder ball as well. The location of 46b may not be unique, but rather in a range, so that when a solder ball/bump 82, shown in FIG. 1(a) as shadowed, is mounted to the device, the pressure of the ball is not directly on top of the RDL 46. As shown in FIG. 1(a), when the solder ball 82 is mounted to the device 30 to connect it to the carrier substrate or printed circuit board (PCB), which will be done in step shown in FIG. 1(e), the outer periphery of the ball 82 projected to the surface of silicon 30, passivation 34 is at a point 101. It may be advantageous that the end 46b terminates at a point before reaching the point 101 so that there is a gap between the end of 46b and the point 101. The solder ball 82 is shown in FIG. 1(a) as shadowed because it is not mounted in FIG. 1(a). It will be mounted in a step shown in FIG. 1(e). The projected point 101 divide the surface of the passivation layer 34 into two regions, one region is for the RDL 46, and another region contains no RDL portion and is used to receive a solder ball, which may be called as a solder ball projection region.

Furthermore, as illustrated in FIG. 1(b), a passivation layer 54 is formed over passivation layers 34 and RDL 46 for structural support and physical isolation. Passivation layer 54 can be made with SiN, SiO2, SiON, PI, BCB, PBO, or other insulating material. The passivation layer 54 may be formed, e.g., conformed with the shape of RDL 46, on top of RDL 46 or on top of the passivation layer 34. At one end, the passivation layer 54 is on top of the surface of the RDL 46 and extends further to cover the top of the conductive pad 32 and beyond. At another end, the passivation layer 54 is formed so that the RDL 46 is completely covered by passivation layer 54. The size of passivation layer 54 is only for illustration purposes and is not limiting.

FIG. 1(c) illustrates that a portion of passivation layer 54 is removed using a mask-defined etching process to expose a portion of RDL 46, forming an opening 65. The size, shape, and location of the opening 65 are only for illustration purposes and are not limiting. There may be other size, shape, and location for the opening 65.

FIG. 1(d) illustrates that a metal layer 73 is deposited over passivation layer 54, and the exposed RDL 46 through the opening 65 by an evaporation, electrolytic plating, electroless plating, or screen printing process. Metal layer 73 is an under bump metallization (UBM) layer which follows the contour of passivation layer 54 and RDL 46. UBM 73 can be made with Ti, Ni, NiV, Cu, Cu alloy, any metal or electrically conductive material. The size, shape, and location of the UBM 73 are only for illustration purposes and are not limiting. There may be other size, shape for the UBM 73. There may be a multiple sub-layers of UBM 73 built on top of each other (not shown).

FIG. 1(e) illustrates that an electrically conductive solder material 91 is deposited over UBM 73 and extending over the opening 65 and its walls, using an electrolytic plating or electroless plating process, or screen printing process. The solder material can be any metal or electrically conductive material, e.g., Sn, lead (Pb), Ni, Au, Ag, Cu, bismuthinite (Bi) and alloys thereof, or mixtures of other electrically conductive material. This conductive solder material 91 is optional. In some embodiments, there may not be any conductive solder material 91 deposited.

FIG. 1(e) further illustrates that a solder ball 82 is mounted on top of the solder material 91 and on top of the UBM 73. The solder ball 82 is positioned so that the projected outer periphery of the ball 82 to the surface of silicon 30 and passivation 34 is at a point 101, and there is a gap between the point 101 and the end point of the RDL 46. The projected point 101 on the passivation layer 34 divides the surface of passivation layer 34 into two regions, one region is to hold the solder ball 82 while the RDL 46 is formed on the surface of another region. In this way, the pressure from the solder ball 82 is on the passivation layer 54 rather than on the RDL layer 46, therefore reducing the cracks since passivation layer 54 has stronger mechanical support.

FIG. 1(f) illustrates a top view of the solder ball 82 mounted on top of semiconductor device 10. The contact pad 32 is connected to the RDL 46, which is further connected to the UBM 73. The circle 101 is the projected outer periphery of the solder ball 82. The circle 101 determines the solder ball projection region, and the RDL 46 is formed in another region with a gap between the end point of RDL 46 and the circle 101. The projected outer periphery of the solder ball 82 is of circular shape. If other connector is used instead of the solder ball 82, the projected shape may not be a circle like 101. As long as there is a gap between the end point of RDL 46 and the projected outer periphery of the connector, then the pressure of the connector would not be directly on the RDL 46 and it can help to reduce the pressure on RDL 46.

The process shown in FIGS. 1(a)-1(e) is only for illustration purposes, and are not limiting. There may be many variations of processing steps and processing materials that can be readily seen by those skilled in the art. FIGS. 2(a)-2(c) illustrate various WLP devices resulting from the WLP process demonstrated in FIGS. 1(a)-1(e).

As illustrated in FIG. 2(a)-2(c), a semiconductor die 30 includes an active surface 31. A conductive layer 32 is formed as a contact pad on the active surface 31. A passivation layer 34 is formed over semiconductor die 30 on top of the surface 31 and on top of the conductive pad 32. An opening of the passivation layer 34 is made to expose the top surface of the conductive pad 32. The surface of the passivation layer 34 is divided into two regions, and in a first region, an RDL 46 is deposited over and it may follow the contour of passivation layer 34 and conductive pad 32. One end of the RDL 46 is on top of the passivation layer 34 and in contact with the conductive pad 32 through the passivation layer opening. The other end of the RDL 46 is stopped somewhere beyond the conductive pad 32 but within the first region. A second region will be used to receive a solder ball 82 so that there is a gap between the end point of RDL 46 and the projected outer periphery of the solder ball 82 to the surface of passivation layer 34. A passivation layer 54 is formed over passivation layers 34 and RDL 46, which may be conformed with the shape of layer 34 and RDL 46 to cover the RDL 46 completely. A portion of passivation layer 54 is removed to expose a portion of the top surface of the RDL 46, forming an opening 65. An UBM layer 73 is deposited over passivation layer 54 and the exposed RDL 46 through the opening 65, to make connection between the UBM layer 73 and the RDL layer 46 which is further connected to the contact pad 32.

In FIG. 2(a), a solder ball 82 is mounted on top of the UBM 73. In FIG. 2(b), an optional electrically conductive solder material 91 is deposited over UBM 73 first, and a solder ball 82 is mounted on top of the solder material 91 and on top of the UBM 73.

Furthermore, as shown in FIG. 2(a), the height of the passivation layer 54 in some embodiments may be in the range of 5 um to 30 um. The size of the 65 opening may be wider than 20 um. The size of the width the solder ball intersection with the UBM layer is around 180 um to 300 um.

FIG. 2(c) further illustrates an additional and optional opening 67 in the layer UBM 73. The opening 67 is also formed in the passivation layer 54, and the UBM 73 is deposited following the contour of the opening 67. In another embodiment, the opening may only be formed only in UBM 73, and the passivation 54 is as formed previously without an opening. The opening 67 may be help to keep the mounted solder ball 82 in a fixed position since it would be easier for the solder ball 82 to maintain its position over the opening 67 as compared to maintain its position over a flat surface.

Figure 3A:
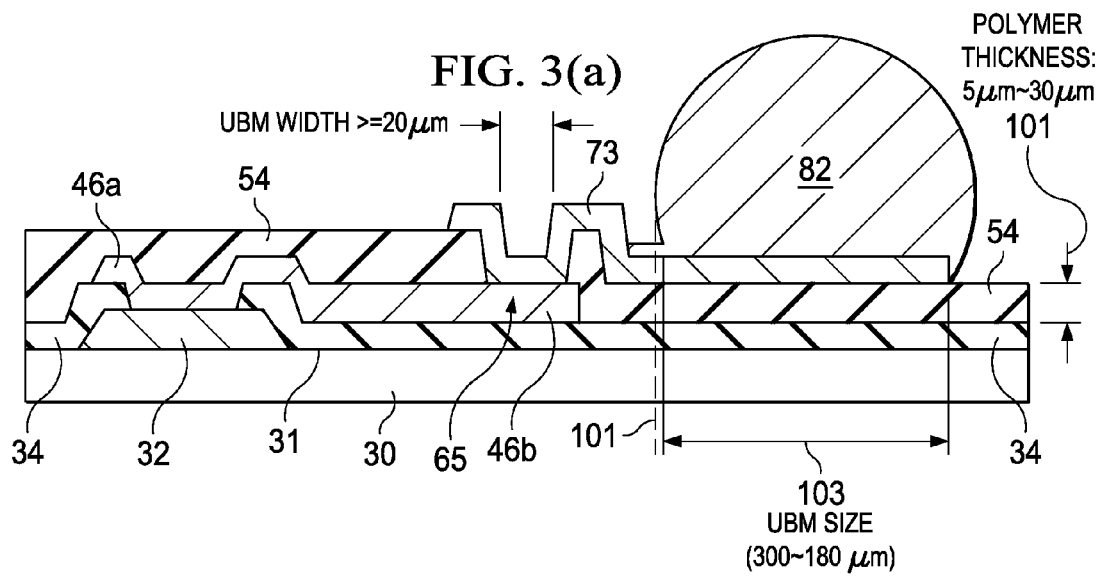
FIGS. 3(a)-3(c) illustrate top views of the connections between a conducting solder ball/bump to a contact pad within a WLP package.
Figure 3B:
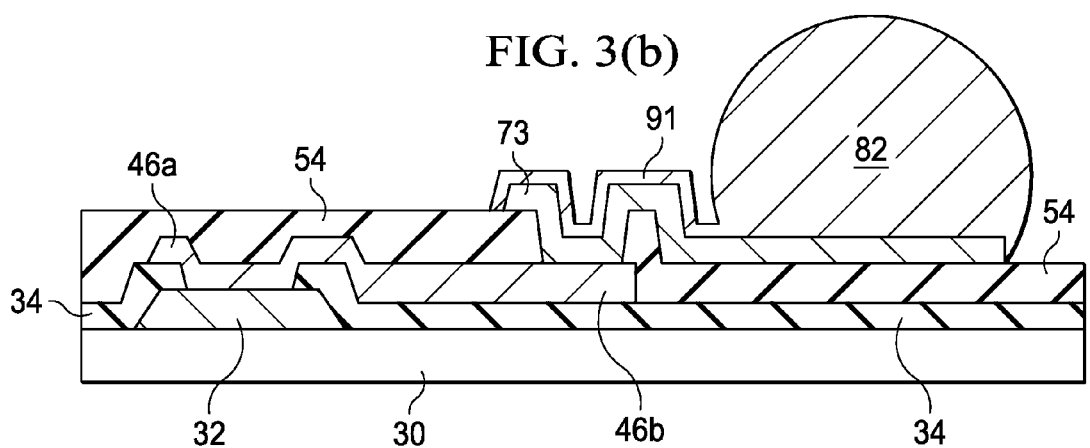
Figure 3C:
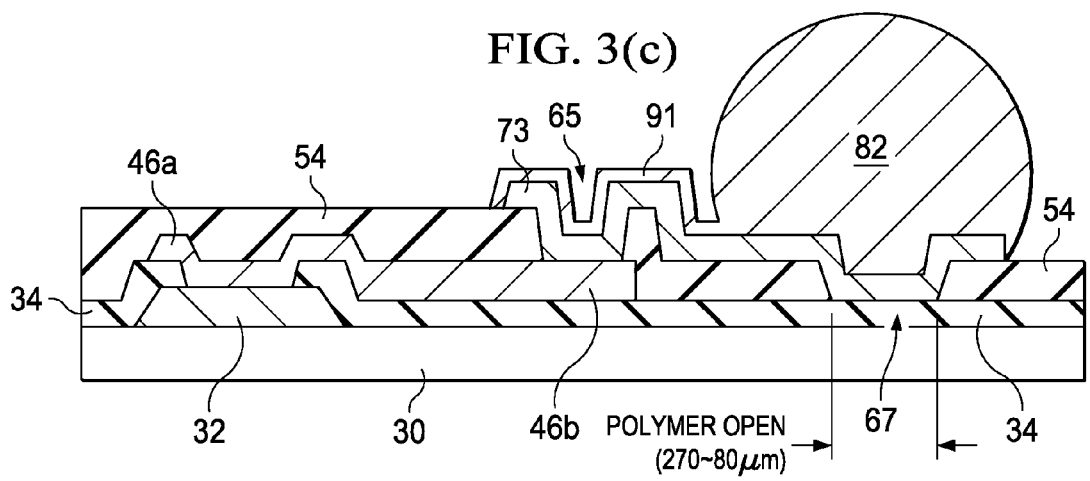

The interconnect structure resulting from the process shown in FIGS. 1(a)-1(e), electrically connects electrical signals from semiconductor die 30 through conductive pad 32 and RDL 46 and further to solder bump 82 by way of UBM 73. RDLs 46 provide a complete inter-level interconnect structure for the WLP without using through hole vias. More details of such connection sequences are shown in FIGS. 3(a)-3(c), which are top views of a WLP formed by the process shown in FIGS. 1(a)-1(e). The UBM 73 may be of different shapes such as shown in FIGS. 3(a), 3(b), and 3(c). In FIG. 3(a), the UBM 73 has a plurality of connection branches which are all connected to the solder ball 82 on one end and to the RDL 46 at the other end, where the RDL 46 is further connected to the contact pad 32. In FIG. 3(c), there is only one branch 73 connecting the solder ball 82 to the RDL layer 46. FIG. 3(b) shows a larger surface of the UBM 73 connected to the solder ball 82 and the smaller end of the UBM 72 is connected to the RDL 46. There may be other forms, shapes, and sizes of UBM 73 connecting the solder ball 82 to the RDL 46, which are not shown.

The embodiments of the present disclosure have several advantageous features. By reducing the length of the RDL layer so that the solder ball is directly on top of the second passivation layer, the stress on the RDL layer is reduced. The reliability of the WLP, on the other hand, is improved.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package device, comprising:
a conductive pad on a surface of a die wherein the surface comprising a first region and a second region disjoint from the first region;
a first passivation layer over the surface and the conductive pad, with a first opening to expose the conductive pad;
a redistribution layer (RDL) on the first passivation layer and the conductive pad, in contact with the conductive pad through the first opening, and over the first region;
a second passivation layer on the RDL layer and the first passivation layer, with a second opening over the first region to expose a portion of the RDL layer; and
an under bump metallization (UBM) layer over the second passivation layer extending from the first region to the second region, and over the second opening over the first region t make contact with the exposed RDL layer;
wherein the second region contains an area of projecting an outer periphery of a solder ball onto the surface.

2. The device of claim 1, further comprising an electrically conductive layer over the UBM layer.

3. The device of claim 1, further comprising a solder ball on top of the UBM layer in the second region.

4. The device of claim 3, further comprising a third opening on the second passivation layer within the second region wherein the UBM layer is deposited over the third opening.

5. The device of claim 1, wherein the RDL layer comprises a plurality of sub-layers.

6. The device of claim 1, wherein the UBM layer comprises a plurality of sub-layers.

7. The device of claim 1, wherein the RDL layer is made with Al, Ni, nickel vanadium (NiV), Cu, or Cu alloy.

8. A device comprising:
a substrate having a surface, the surface having a first region configured to receive a connector element and a second region disjoint from the first region;
a contact pad formed in the second region of the surface;
a redistribution layer (RDL) within the second region electrically connected to the contact pad, wherein the RDL extends laterally from the contact pad, but does not extend into the first region;
an under bump metallization (UBM) element extends from the first region to the second region, electrically connected to the RDL, wherein the UBM extends from the RDL and extends into the first region.

9. The device of claim 8 further comprising a solder ball electrically connected to the UBM element in the first region.

10. The device of claim 8 further comprising a first passivation layer over the substrate, having a hole therein wherein the RDL passes to connect to the contact pad.

11. The device of claim 10 further comprising a second passivation layer over the substrate, having a hole therein wherein the UBM element passes to connect to the RDL.

12. The device of claim 8 wherein the first region is defined by an outer periphery of a connector element projected onto the surface of the substrate.

13. The device of claim 12 wherein the first region has a circular shape.

14. The device of claim 8 wherein the connector element is a solder ball or a solder bump.

15. A package device, comprising:
a conductive pad on a surface of a substrate, wherein the surface comprising a first region and a second region disjoint from the first region;
a redistribution layer (RDL) above the first region of the surface of the substrate and electrically connected to the conductive pad;

a passivation layer on the RDL layer, with a first opening to expose a portion of the RDL layer; and an under bump metallization (UBM) layer extending from the first region to the second region, over the second region of the surface of the substrate, over the passivation layer, and over the first opening to make contact with the exposed RDL layer;

wherein the second region contains an area of projecting an outer periphery of a connector onto the surface.

16. The device of claim 15, further comprising a solder ball electrically connected to the UBM layer on the second region.

17. The device of claim 15 further comprising a second passivation layer over the substrate, having a second opening therein wherein the RDL passes to connect to the conductive pad.

18. The device of claim 15, wherein the second region has a circular shape.

19. The device of claim 15, wherein the connector is a solder ball or a solder bump.

20. The device of claim 15, wherein the RDL layer is made with Al, Ni, nickel vanadium (NiV), Cu, or Cu alloy.

* * * * *

UNITED STATES PATENT AND TRADEMARK OFFICE
CERTIFICATE OF CORRECTION

PATENT NO. : 8,569,886 B2
APPLICATION NO. : 13/302551
DATED : October 29, 2013
INVENTOR(S) : Chia-Wei Tu It is certified that error appears in the above-identified patent and that said Letters Patent is hereby corrected as shown below:

In the Specifications

Figure 2A:
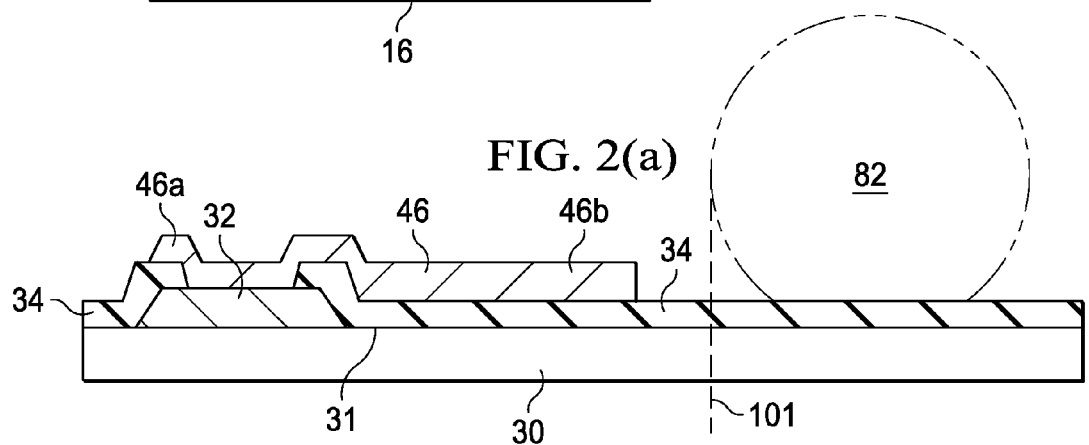
FIGS. 2(a)-2(c) illustrate embodiments of detailed cross-sectional views of WLP semiconductor devices.
Figure 2B:
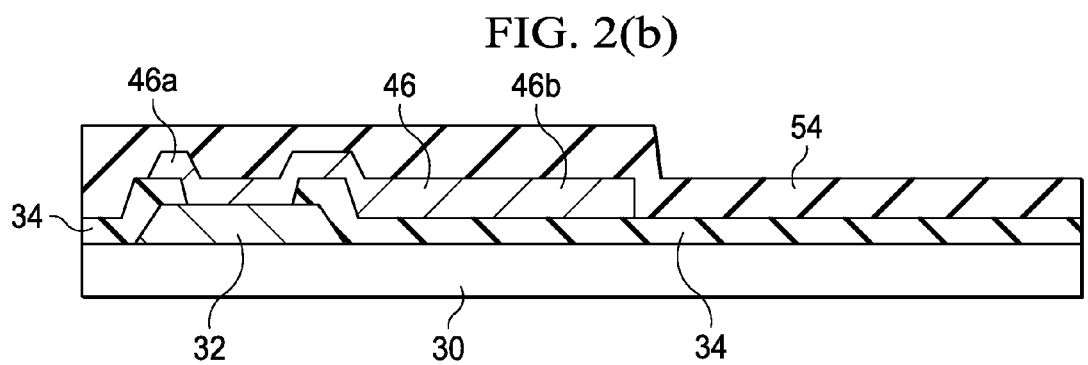
Figure 2C:
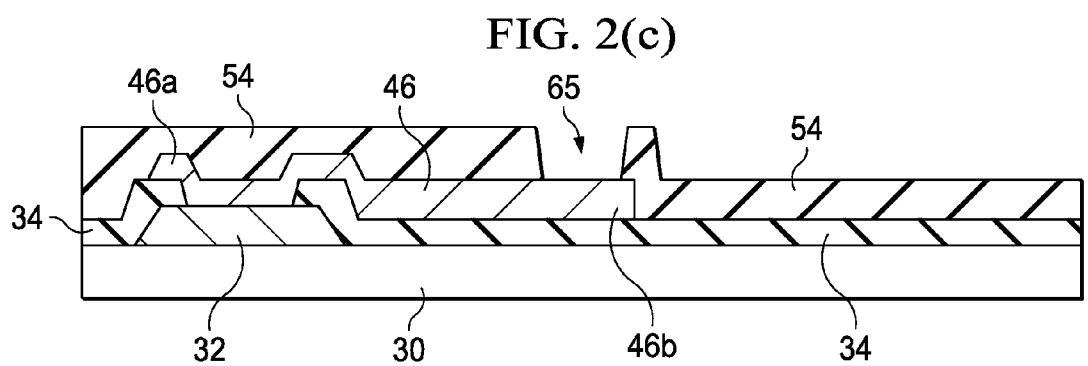

In Col. 1, line 32, Background, insert --Figure 1 illustrates a cross-section view of a device 10 with a first substrate 14 and a first layer 12 over the first substrate 14. First pads 24 within the first layer 12 are in contact with a connector 22, which is also in contact with second pads 26 within a second substrate 16.--.

In Col. 1, line 38, Brief Description of the Drawings, insert --FIG. 1 illustrates a cross-section view of a device--.

In Col. 1, line 39, Brief Description of the Drawings, delete "FIGS. 1(a)-1(f)" and insert --FIGS. 2(a)-2(f)--.

In Col. 1, line 41, Brief Description of the Drawings, delete "FIGS. 2(a)-2(c)" and insert --FIGS. 3(a)-3(c)--.

Figure 4A:
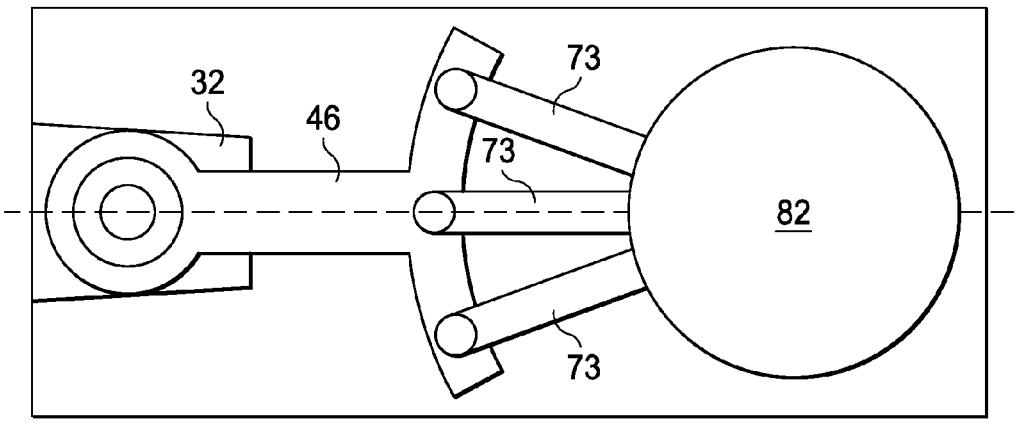
Figure 4B:
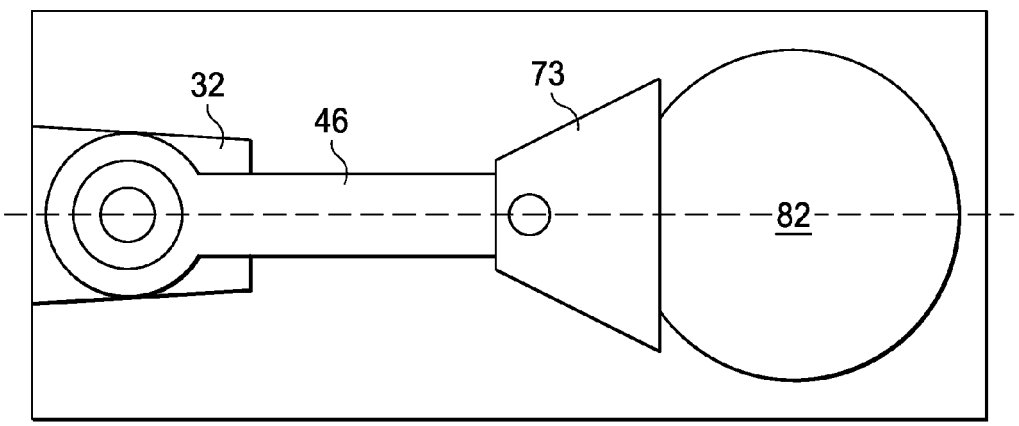
Figure 4C:
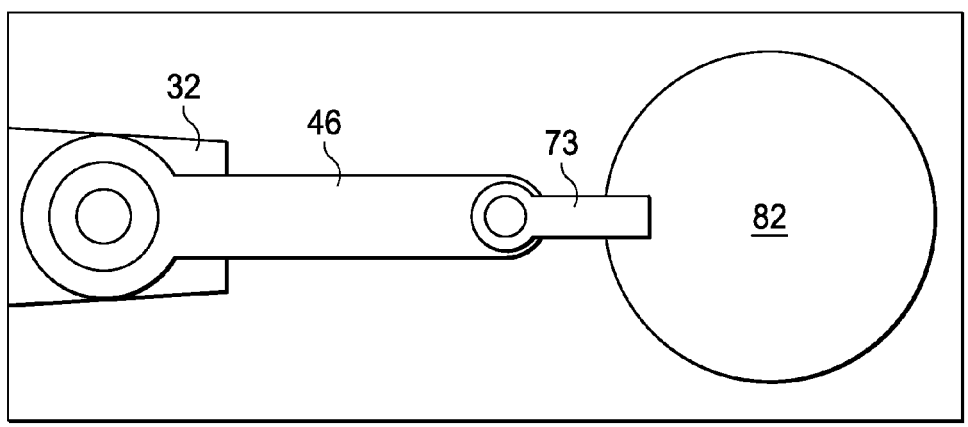

In Col. 1, line 43, Brief Description of the Drawings, delete "FIGS. 3(a)-3(c)" and insert --FIGS. 4(a)-4(c)--.

In Col. 2, line 7, Detailed Description of Illustrative Embodiments, delete "FIGS. 1(a)-1(f)" and insert --FIGS. 2(a)-2(f)--.

In Col. 2, line 9, Detailed Description of Illustrative Embodiments, delete "FIG. 1(a)" and insert --FIG. 2(a)--.

In Col. 2, line 14, Detailed Description of Illustrative Embodiments, delete "FIGS. 1(a)-1(e)" and insert --FIGS. 2(a)-2(e)--.

Figure 2D:
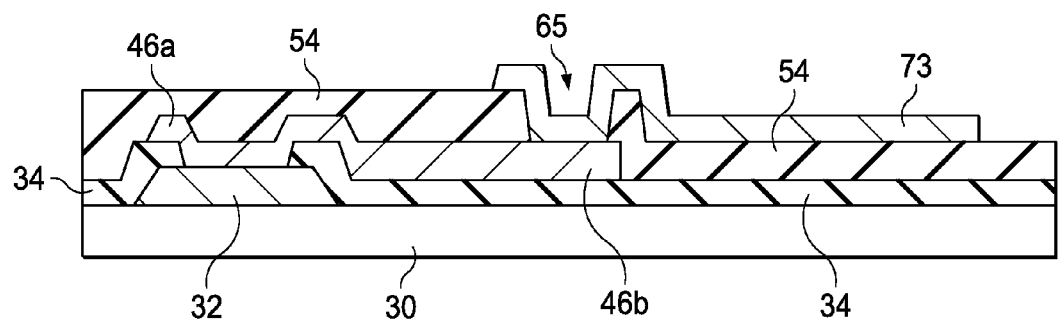
Figure 2E:
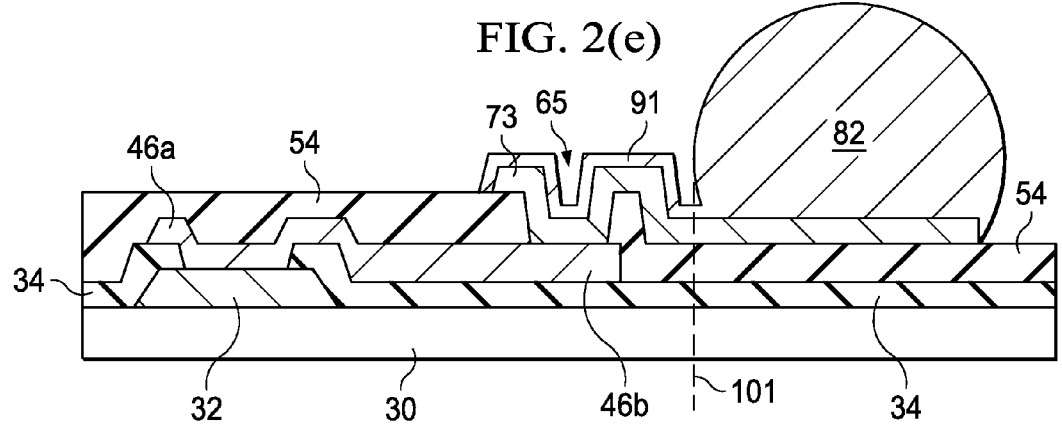

In Col. 2, line 18, Detailed Description of Illustrative Embodiments, delete "FIG. 1(e)" and insert --FIG. 2(e)--.

In Col. 2, line 51, Detailed Description of Illustrative Embodiments, delete "FIG. 1(a)" and insert --FIG. 2(a)--.

In Col. 2, line 65, Detailed Description of Illustrative Embodiments, delete "FIG. 1(a)" and insert --FIG. 2(a)--.

In Col. 3, line 15, Detailed Description of Illustrative Embodiments, delete "FIG. 1(a)" and insert --FIG. 2(a)--.

Signed and Sealed this
First Day of April, 2014

Michelle K. Lee
*Deputy Director of the United States Patent and Trademark Office*

In Col. 3, line 17, Detailed Description of Illustrative Embodiments, delete "FIG. 1(a)" and insert --FIG. 2 (a)--.

In Col. 3, line 20, Detailed Description of Illustrative Embodiments, delete "1(e)" and insert --2(e)--.

In Col. 3, line 25, Detailed Description of Illustrative Embodiments, delete "1(a)" and insert --2(a)--.

In Col. 3, line 25, Detailed Description of Illustrative Embodiments, delete "FIG. 1(a)" and insert --FIG. 2(a)--.

In Col. 3, line 26, Detailed Description of Illustrative Embodiments, delete "FIG. 1(e)" and insert --FIG. 2(e)--.

In Col. 3, line 31, Detailed Description of Illustrative Embodiments, delete "FIG. 1(b)" and insert --FIG. 2(b)--.

In Col. 3, line 44, Detailed Description of Illustrative Embodiments, delete "FIG. 1(c)" and insert --FIG, 2(c)--.

In Col. 3, line 50, Detailed Description of Illustrative Embodiments, delete "FIG. 1(d)" and insert --FIG. 2(d)--.

In Col. 3, line 62, Detailed Description of Illustrative Embodiments, delete "FIG. 1(e)" and insert --FIG. 2(e)--.

In Col. 4, line 5, Detailed Description of Illustrative Embodiments, delete "FIG. 1(e)" and insert --FIG. 2(e)--.

Figure 2F:
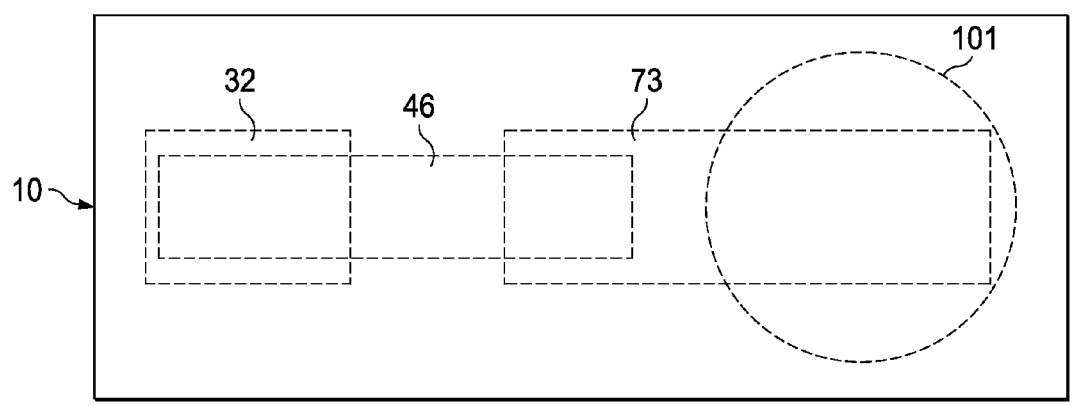

In Col. 4, line 18, Detailed Description of Illustrative Embodiments, delete "FIG. 1(f)" and insert --FIG. 2(f)--.

In Col. 4, line 35, Detailed Description of Illustrative Embodiments, delete "FIGS. 1(a)-1(e)" and insert --FIGS. 2(a)-2(e)--.

In Col. 4, line 38, Detailed Description of Illustrative Embodiments, delete "FIGS. 2(a)-2(e)" and insert --FIGS. 3(a)-3(e)--.

In Col. 4, line 40, Detailed Description of Illustrative Embodiments, delete "FIGS. 1(a)-1(e)" and insert --FIGS. 2(a)-2(e)--.

In Col. 4, line 41, Detailed Description of Illustrative Embodiments, delete "FIGS. 2(a)-2(e)" and insert --FIGS. 3(a)-3(e)--.

In Col. 5, line 1, Detailed Description of Illustrative Embodiments, delete "FIG. 2(a)" and insert --FIG. 3(a)--.

In Col. 5, line 2, Detailed Description of Illustrative Embodiments, delete "FIG. 2(b)" and insert --FIG. 3(b)--.

In Col. 5, line 6, Detailed Description of Illustrative Embodiments, delete "FIG. 2(a)" and insert --FIG. 3(a)--.

In Col. 5, line 11, Detailed Description of Illustrative Embodiments, delete "FIG. 2(c)" and insert --FIG. 3(c)--.

In Col. 5, line 23, Detailed Description of Illustrative Embodiments, delete "FIGS. 1(a)-1(e)" and insert --FIGS. 2(a)-2(e)--.

In Col. 5, line 29, Detailed Description of Illustrative Embodiments, delete "FIGS. 3(a)-3(c)" and insert --FIGS. 4(a)-4(c)--.

In Col. 5, line 30, Detailed Description of Illustrative Embodiments, delete "FIGS. 1(a)-1(e)" and insert --FIGS. 2(a)-2(e)--.

CERTIFICATE OF CORRECTION (continued)
U.S. Pat. No. 8,569,886 B2

In Col. 5, line 31, Detailed Description of Illustrative Embodiments, delete "FIGS. 3(a), 3(b), and 3(c)" and insert --FIGS. 4(a), 4(b) and 4(c)--.

In Col. 5, line 32, Detailed Description of Illustrative Embodiments, delete "FIG. 3(a)" and insert --FIG. 4(a)--.

In Col. 5, line 35, Detailed Description of Illustrative Embodiments, delete "FIG. 3(c)" and insert --FIG. 4(c)--.

In Col. 5, line 37, Detailed Description of Illustrative Embodiments, delete "FIG. 3(b)" and insert --FIG. 4(b)--.